(12) United States Patent
Chen et al.

(10) Patent No.: US 7,462,885 B2
(45) Date of Patent: Dec. 9, 2008

(54) ESD STRUCTURE FOR HIGH VOLTAGE ESD PROTECTION

(75) Inventors: Shui-Hung Chen, Hsinchu (TW);
Jian-Hsing Lee, Hsin-Chu (TW);
Yi-Hsun Wu, Hsin-Chu (TW); D. J. Perng, Hsinchu (TW); Anthony Oates, Hsinchu (TW)

(73) Assignee: Taiwan Semiconductor Manufacturing Co., Hsin-Chu (TW)

( * ) Notice: Subject to any disclaimer, the term of this patent is extended or adjusted under 35 U.S.C. 154(b) by 64 days.

(21) Appl. No.: 11/606,424

(22) Filed: Nov. 30, 2006

(65) Prior Publication Data

US 2008/0128818 A1    Jun. 5, 2008

(51) Int. Cl.
*H01L 29/72* (2006.01)
*H01L 23/62* (2006.01)

(52) U.S. Cl. .................. 257/173; 257/355; 257/362; 257/E29.225

(58) Field of Classification Search .......... 257/173, 257/355, 361, 362, E29.225; 438/135
See application file for complete search history.

(56) References Cited

U.S. PATENT DOCUMENTS

| | | | | |
|---|---|---|---|---|
| 6,265,752 B1 * | 7/2001 | Liu et al. | .................. | 257/487 |
| 6,303,964 B1 * | 10/2001 | Pulvirenti et al. | ........... | 257/355 |
| 6,365,932 B1 * | 4/2002 | Kouno et al. | ................. | 257/341 |
| 7,049,663 B2 * | 5/2006 | Wang | .......................... | 257/355 |
| 7,061,051 B2 * | 6/2006 | Yu | .............................. | 257/355 |
| 7,304,354 B2 * | 12/2007 | Morris | ...................... | 257/372 |
| 2006/0118902 A1 * | 6/2006 | Ikuta et al. | ................... | 257/491 |

* cited by examiner

*Primary Examiner*—Tuan N. Quach
(74) *Attorney, Agent, or Firm*—K & L Gates LLP

(57) ABSTRACT

An electrostatic discharge-protected MOS structure is disclosed. An electrostatic discharge-protected MOS structure includes a semiconductor substrate of a first type, a first well of the first type formed in the semiconductor substrate, and a second well of a second type disposed adjacent to the first well. The MOS structure further includes a source region, a drain region, and an oxide layer and a polysilicon layer for forming a gate electrode of the MOS structure. In addition, the MOS structure includes a parasitic SCR comprising at least a parasitic NPN bipolar transistor and a buried layer of the second type interposed between the second well and the semiconductor substrate. The buried layer functions to lower a resistance of the semiconductor substrate during an ESD event so that ESD currents generated by the parasitic SCR are dissipated through the buried layer and the semiconductor substrate, thereby protecting the MOS structure.

17 Claims, 6 Drawing Sheets

ESD STRUCTURE FOR HIGH VOLTAGE ESD PROTECTION

BACKGROUND

The present invention relates generally to the protection of integrated circuits (ICs) from electrostatic discharge (ESD), and more particularly to an improved ESD structure for protection against high voltage ESD events.

As IC devices continue to shrink, they become more susceptible to ESD damage. ESD events occur when charges are transferred between one or more pins of an IC device and a conducting object in a short period of time, typically less than one microsecond. The rapid charge transfer often generates voltages large enough to destroy such insulating films as silicon dioxide layers, and also causes permanent damage to IC devices. To cope with ESD-related problems, IC manufacturers have designed various ESD structures to protect IC devices from ESD damage.

In a typical IC device, metal-oxide-semiconductor (MOS) devices without effective ESD protection can be easily damaged by ESD current because their thin gate oxide layers can be easily destroyed by voltages generated during an ESD event. Electrostatic voltages from common environmental sources can reach thousands or even tens of thousands of volts. Such voltages can be destructive even if their resulting current level is extremely small. For this reason, it is critical to discharge any electrostatic charge before it accumulates to a damaging voltage.

Although conventional ESD structures for protecting a MOS device against ESD damage are commonly available, they may not efficiently dissipate high voltage (HV) ESD current because the resistance across the substrate of the MOS device is high. For example, a silicon-controlled-rectifier (SCR), a conventional ESD structure, formed across the substrate cannot be triggered easily at a low voltage because of the high substrate resistance. This may cause heat to accumulate within the ESD structure, resulting in damage to the MOS device. Many attempts have been made in the past to improve HV ESD protection by simply increasing the dimension of the ESD structure. However, this approach turned out to be ineffective because it merely generates an ESD structure with a gradient doping profile that does not dissipate ESD current efficiently.

Therefore, there is a need for an ESD structure for dissipating ESD current more efficiently to improve ESD performance.

SUMMARY OF THE INVENTION

In view of the foregoing, the present invention provides a novel structure for ESD protection without adding extra process steps to the conventional MOS process. In one embodiment, an electrostatic discharge-protected MOS structure is disclosed. The MOS structure includes a P-type substrate, an N-type buried layer implemented in the P-type substrate, and at least an N-well and a P-well formed on top of the N-type buried layer. The MOS structure further includes a parasitic silicon controlled rectifier comprising oa at least a parasitic NPN bipolar transistor formed by the N-well, the P-type substrate, and an N+ source region, respectively. In addition, the MOS structure includes at least an oxide layer and a polysilicon layer formed on top of the N-well and the P-well, wherein during an ESD event, ESD currents are dissipated through the buried layer and the semiconductor substrate, thereby protecting the MOS structure.

The features and advantages described in the specification are not all inclusive, and particularly, many additional features and advantages will be apparent to one of ordinary skill in the art in view of the drawings, specification, and claims hereof. Moreover, it should be noted that the language used in the specification has been principally selected for readability and instructional purposes, and may not have been selected to delineate or circumscribe the inventive subject matter and resort to the claims being necessary to determine such inventive subject matter.

BRIEF DESCRIPTION OF THE DRAWINGS

The invention is herein described with reference to the accompanying drawings. The drawings depict various preferred embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION OF THE INVENTION

The present invention relates to the protection of IC devices from ESD, and the following will provide a detailed description of an ESD structure for protection against HV ESD events.

Figure 1A:
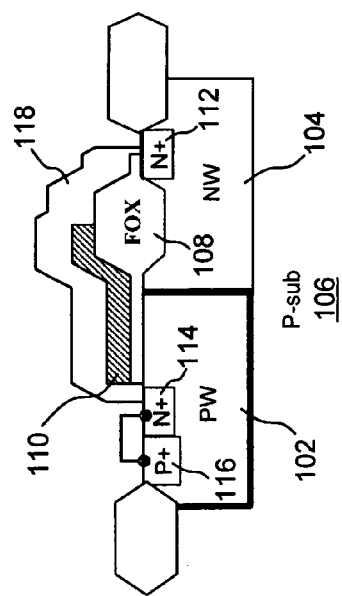
FIG. 1A illustrates a cross-sectional diagram of an NMOS transistor implemented with a conventional ESD structure.

FIG. 1A illustrates a cross-sectional diagram of an NMOS transistor implemented with a conventional ESD structure. The NMOS transistor 100 is a twin-well MOS device fabricated on a P-well 102 and an N-well 104, both formed within a P-type substrate 106. The P-well 102 provides a source area of the NMOS transistor 100 while the N-well 104 provides a drain area. A field oxide layer 108 is formed partially over the P-well 102 and the N-well 104 before a polysilicon layer 110 is deposited to provide a gate electrode for the NMOS transistor 100. Both the P-well 102 and the N-well 104 are also implemented with a well contact. For the N-well 104, an N+ well contact 112 is implemented as the drain contact. The P-well 102 is implemented with an N+ source region 114 as the source contact, and a P+ well contact 116. The N+ source region contact 114 and the P+ well contact 116 are electrically coupled together to ground. A dielectric layer 118 is deposited on the polysilicon gate 110 and the field oxide layer 108 to protect its underlying layers from the external environment.

With this ESD structure, a parasitic silicon controlled rectifier (SCR) comprising parasitic NPN and PNP bipolar transistors are formed at the junction between the N-well 104 and the P-type substrate 106. This parasitic SCR can discharge ESD voltages as it will be described in more detail below with reference to FIG. 1B. However, in this conventional ESD structure, the resistance at the P-type substrate 106 and the collector regions of the PNP and NPN transistors within the parasitic SCR are fairly high. Due to this high resistance, excessive heat tends to build up before the damaging ESD current can be dissipated when high voltage ESD occurs. This can result in damage to the MOS transistor 100 implemented with the ESD structure described above.

Figure 1B:
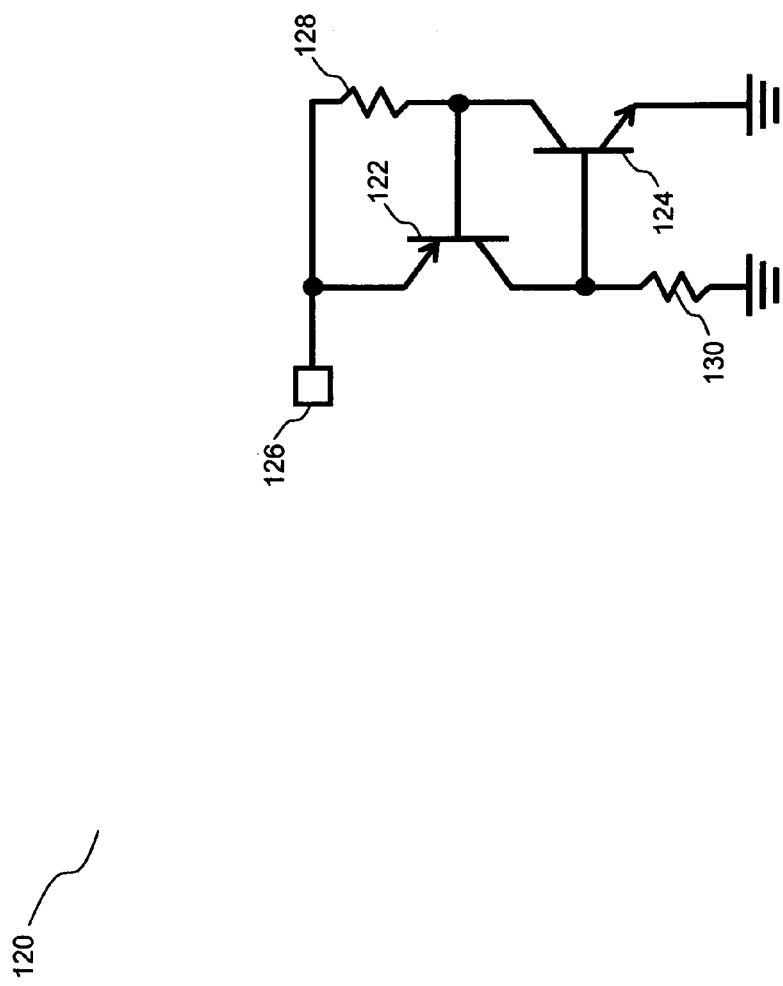
FIG. 1B illustrates a circuit diagram showing an SCR that is formed within an ESD structure as the one shown in FIG. 1A.

FIG. 1B illustrates a circuit diagram showing a SCR that is formed within an ESD structure as the one shown in FIG. 1A. The SCR circuit 120 comprises a parasitic PNP bipolar transistor 122, a parasitic NPN bipolar transistor 124, a pad 126, and two resistors 128 and 130 representing the resistance of the N-well 104 and P-type substrate 106 shown in FIG. 1A, respectively.

In a typical CMOS process, the PNP bipolar transistor 122 and the NPN bipolar transistor 124 are parasitic devices. The emitter, base, and collector of the parasitic PNP bipolar transistor 122 are formed by the P+ diffusion inside the N-well (not shown), N-well 104, and the P-type substrate 106 shown in FIG. 1A. The emitter, base, and collector of the parasitic NPN bipolar transistor 124 are formed by the N-well 104, the P-type substrate 106, and the N+ diffusion 114 in the P-well 102 shown in FIG. 1A. It is understood by one skilled in the art that the "+" designation denotes a high level of dopant impurity concentration. For example, an N+ region means an N-type region with a high concentration of electrons and areas designated as N+ will generally have a higher dopant concentration than those simply designated as N-type.

Referring to FIG. 1B, the collector of the PNP bipolar transistor 122 is connected to the base of the NPN bipolar transistor 124 while the emitter of the PNP bipolar transistor 122 is coupled to the pad 126. Both the base of the PNP bipolar transistor 122 and the collector of NPN bipolar transistor 124 are connected to the resistor 128, which represents the resistance of the N-well 104. The resistor 130 represents the resistance of the P-type substrate 106.

A parasitic SCR, formed at the junction between the N-well 104 and the P-type substrate 106, can be used to protect ICs as long as its trigger voltage is low enough to discharge ESD voltages effectively. However, in this conventional ESD structure, the resistance of the P-type substrate 106 and/or the collector regions of the parasitic PNP and NPN transistors of the SCR 120 are fairly high. Accordingly, when high voltage ESD occurs, excessive heat usually builds up before the damaging current can be dissipated, thereby causing damage to the ESD structure comprising of the parasitic SCR as well as the NMOS transistor 100.

The parasitic SCR 120 is triggered during an ESD event by the collector-base avalanche of either the PNP bipolar transistor 122 or the NPN bipolar transistor 124. For example, if the NPN bipolar transistor 124 avalanches first, carriers injected into the base of the NPN bipolar transistor 124 will cause the transistor to conduct. This allows the NPN bipolar transistor 124 to pull current from the base of the PNP bipolar transistor 122, thereby forcing it to turn on and provide additional base drive for the NPN bipolar transistor 124. Conduction will continue until the input voltage drops to a point where resistors 128 and 130 can extract more current than what bipolar transistors 122 and 124 can supply. However, in the conventional ESD structure shown in FIGS. 1A and 1B, the PNP bipolar transistor 122 and the NPN bipolar transistor 124 are not designed to handle a high voltage ESD. The P-type substrate and collector resistance values of the two bipolar transistors 122 and 124 may be too high, thus causing heat to accumulate resulting in damage to the MOS transistor implemented with the ESD structure.

Figure 1C:
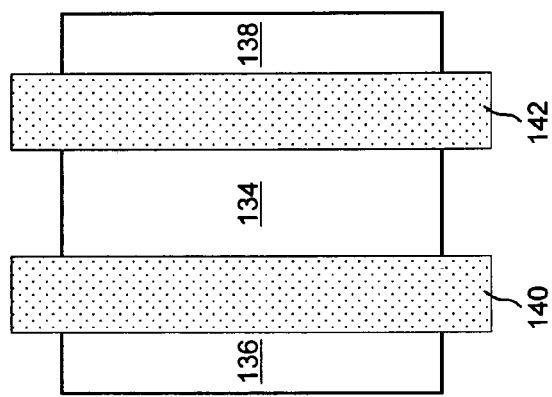
FIG. 1C illustrates a layout diagram for an MOS transistor that is implemented with a conventional ESD structure.

FIG. 1C illustrates a layout diagram for a MOS transistor that is implemented with a conventional ESD structure. The layout structure 132 includes a drain region 134, two sections of source regions 136 and 138, and polysilicon gate electrodes 140 and 142. This layout diagram 132 for the conventional ESD structure is not implemented with an N-type buried layer (N+BL) as shown in FIG. 2.

Figure 2:
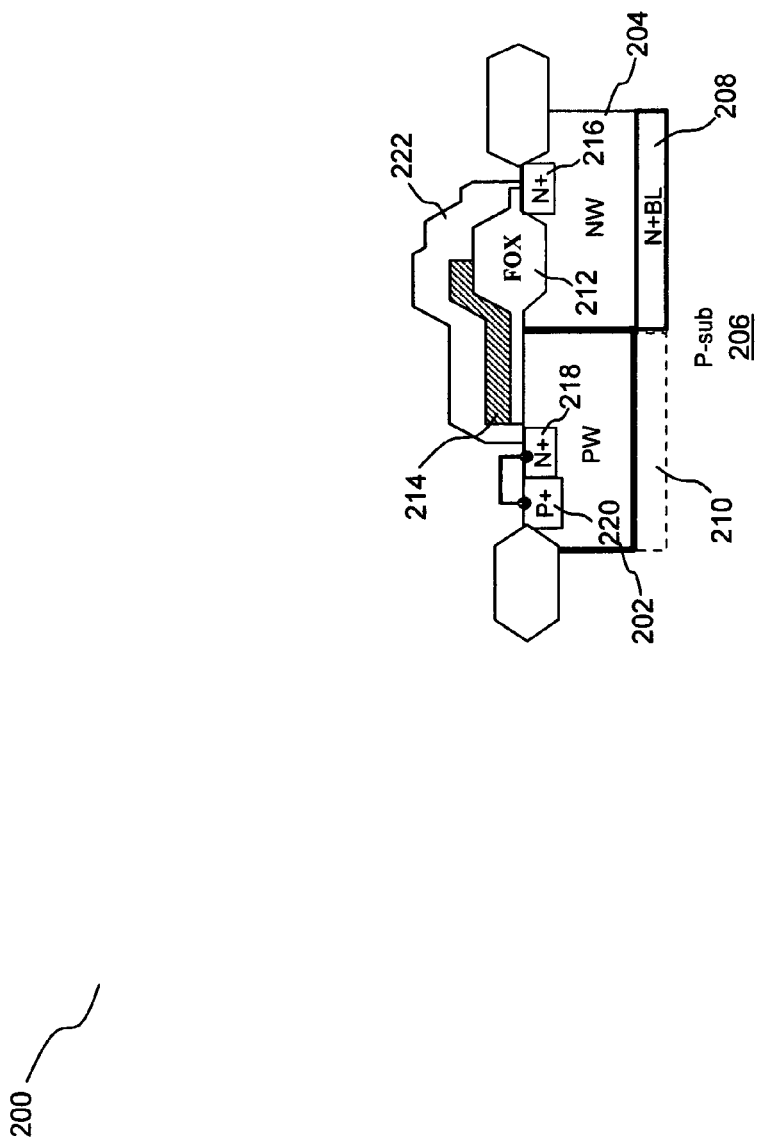
FIG. 2 illustrates a cross-sectional diagram of an NMOS transistor implemented with a HV ESD structure having an N-type buried layer (N+BL) in accordance with one embodiment of the present invention.

FIG. 2 illustrates a cross-sectional diagram of an NMOS transistor implemented with a HV ESD structure having an N-type buried layer (N+BL) in accordance with one embodiment of the present invention. The NMOS transistor 200 is a twin-well MOS device that is similar to the NMOS transistor 100 shown in FIG. 1A with an additionally implemented N-type buried layer, N+BL 208.

The NMOS transistor 200 comprises a P-well 202 and an N-well 204, both formed within a P-type substrate 206. The P-well 202 is designed to provide the N+ source area of the NMOS transistor 200 while the N-well 204 provides the N+ drain area 216. A heavily doped N-type buried layer, N+BL 208, is implemented between the P-type substrate 206 and the N-well 204 to form a partial HV ESD structure. The impurity ions used for forming the N+BL 208 comprise such n-type impurity ions as phosphorus and arsenic. However, for some high voltage applications, antimony can be used as well.

The N+BL 208 is designed to reduce the resistance at the P-type substrate 206, which helps a parasitic SCR comprising parasitic NPN and PNP bipolar transistors conduct large ESD currents efficiently during ESD events without causing heat to accumulate. It should be noted that the circuit diagram of the SCR within this NMOS transistor 200 is identical to the conventional SCR circuit 120 of FIG. 1B. The key difference is the reduction of resistance value at the P-type substrate and collector regions of the PNP and NPN bipolar transistors within the circuit due to the addition of the N+BL 208.

The N+BL 208 may be optionally extended into a region 210 between the P-type substrate 206 and the P-well 202 to form a full HV ESD structure, thereby further improving the HV ESD performance. A partial HV ESD structure and full HV ESD structures will be described in more detail below with reference to FIGS. 3A and 3B. By adjusting the dimension of the N+BL 208 formed between the wells 202/204 and the P-type substrate, the human body model (HBM) ESD passing voltage and the snapback voltage (VT1) of the NMOS transistor 200 implemented with the ESD structure can be improved. It should be noted that the implementation of the N+BL 208 may not require additional mask steps since it utilizes existing process steps that are necessary for fabricating conventional HV MOS devices as described more below.

The other process steps for forming the NMOS transistor 200 are similar to the ones used for creating the NMOS transistor 100 of FIG. 1A. A layer of field oxide 212 is deposited above the P-well 202 and the N-well 204 before a poly-gate 214 is deposited to form the gate of the NMOS transistor 200. An N+ drain contact 216 and P+ diffusion region (not shown) are implemented in the N-well 204, and an N+ source contact 218 as well as a P+ P-well contact 220 are formed in the P-well 202. The N+ source contact 218 and the P+ P-well contact 220 are electrically coupled. A dielectric layer 222 is deposited above the poly-gate 214 and the field oxide 212 to protect the underlying structure from the external environment. It should be noted that this proposed HV ESD structure is not limited to NMOS transistors, as it may also be implemented into other types of MOS transistors.

Figure 3A:
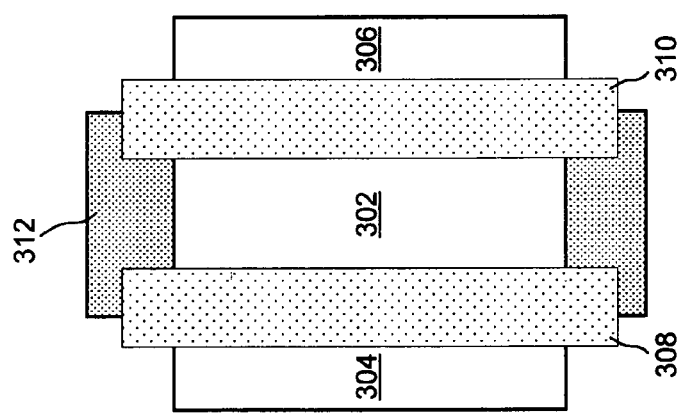
FIG. 3A illustrates a layout diagram for an MOS transistor that is implemented with a partial N+BL ESD structure in accordance with one embodiment of the present invention.
Figure 3A:
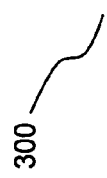

FIG. 3A illustrates a layout diagram for an MOS transistor that is implemented with a partial N+BL ESD structure in accordance with one embodiment of the present invention. The layout structure 300 comprises a drain region 302, two sections of source regions 304 and 306, and two polysilicon gate electrodes 308 and 310. An N+BL region 312 is implanted heavily with N-type impurity ions, such as phosphorous ions, to provide a partial HV ESD structure with the N+BL layer formed below the N-well 204 as shown in FIG. 2. As described above, the partial HV ESD structure can help conduct ESD current into the silicon substrate, which is not shown in this figure, to dissipate HV ESD currently and efficiently during ESD events.

Figure 3B:
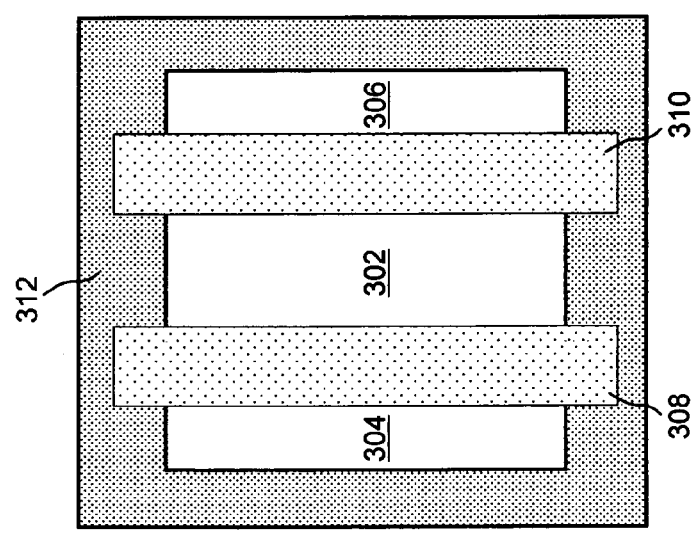
FIG. 3B illustrates a layout structure for an MOS transistor that is implemented with a full N+BL ESD structure in accordance with one embodiment of the present invention.

FIG. 3B illustrates a layout structure for an MOS transistor that is implemented with a full N+BL ESD structure in accordance with one embodiment of the present invention. The layout structure 314 is identical to the layout structure 300 of FIG. 3A with an exception that the N+BL region 312 is further extended to cover the entire layout structure 314 to create a full HV ESD structure. The extended N+BL region 312 is implanted heavily with N-type impurity ions to provide a full HV ESD structure below the drain region 302 and the source region 304 and 306 in order to form a full HV ESD structure. The full HV ESD structure can help conduct ESD current into the silicon substrate to dissipate HV ESD currently and efficiently during ESD events and to further improve the HV ESD performance of the MOS transistors within the layout structure 314.

By implementing a layer of N-type buried layer N+BL in the semiconductor substrate below the N-well or P-well region, the substrate resistance and the collector resistance of the parasitic PNP and NPN transistors within the parasitic SCR may be reduced, thereby allowing the HV ESD current to be dissipated more efficiently during an ESD event. As known to those in the art and as discussed above, the parasitic SCR is triggered into conduction during an ESD event by the collector-base avalanche of either the PNP bipolar transistor or the NPN bipolar transistor. This method of implementing a layer of N+BL may not require additional mask or process steps during fabrication processes since it utilizes existing process steps that are necessary for fabricating conventional HV MOS devices. It should be noted that the buried layer implementation is not limited to the current example shown above, and that other implementations, e.g. PMOS transistor, by using different materials are also contemplated without deviating from the present invention.

As described above, the HV ESD performance of the MOS transistor, including the HBM ESD voltages and snapback voltages (VT1), can be controlled by adjusting the dimension of the N+BL region or by varying the N+BL cover ratio. The N+BL cover ratio is zero (0) if no N+BL layer is formed under the N-well or P-well region and one (1) if a full HV ESD structure is formed as shown in FIG. 3B. The N+BL cover ratio will range from zero to one.

In one embodiment, the N+BL layer is implemented for part of an MOS device to form a partial HV ESD structure where the N+BL cover ratio is lower than 1. In another embodiment, the N+BL layer may also be implemented for the entire MOS device where the N+BL cover ratio is 1 to provide a full HV ESD structure. Depending on the ESD requirements of each product, a dimension of the N+BL region can be modulated so that a different ESD performance can be obtained. It should be noted that an improved ESD performance is obtained as the N+BL cover ratio increases.

The above illustration provides many different embodiments or embodiments for implementing different features of the invention. Specific embodiments of components and processes are described to help clarify the invention. These are, of course, merely embodiments and are not intended to limit the invention from that described in the claims.

From the above description, it will be apparent that the invention disclosed herein provides a novel and advantageous HV ESD structure where a partial or full N+BL layer is implemented. The foregoing discussion discloses and describes merely exemplary methods and embodiments of the present invention. As will be understood by those familiar with the art, the invention may be embodied in other specific forms without departing from the spirit or essential characteristics thereof. For example, a PMOS transistor having a variable P-type buried layer can be formed instead. Accordingly, the disclosure of the present invention is intended to be illustrative, but not limiting, of the scope of the invention, which is set forth in the following claims.

What is claimed is:

1. An electrostatic discharge-protected MOS structure comprising:
   a semiconductor substrate of a first conductivity type;
   a first well of the first conductivity type formed in the semiconductor substrate;
   a second well of a second conductivity type disposed adjacent to the first well, the second conductivity type being different from the first conductivity type;
   a source region and a drain region, both doped with impurities of the second conductivity type and formed in the first well and the second well, respectively;
   a P+ diffusion region formed inside the second well;
   an oxide layer and a polysilicon layer formed on top of the first well and the second well for forming a gate electrode of the MOS structure;
   a parasitic SCR comprising at least a parasitic PNP bipolar transistor formed by the P+ diffusion region formed inside the second well, the second well, and the semiconductor substrate and at least a parasitic NPN bipolar transistor formed by the second well, the semiconductor substrate, and the source region respectively; and
   a buried layer of the second conductivity type interposed at least between the second well and the semiconductor substrate, wherein the buried layer lowers a resistance of the semiconductor substrate such that during an ESD event, ESD currents generated by the parasitic SCR are dissipated through the buried layer and the semiconductor substrate, thereby protecting the MOS structure, wherein a dimension of the buried layer is adjusted to improve an ESD performance of the MOS structure.

2. The structure of claim 1, wherein the buried layer includes a higher dopant impurity concentration than the second well.

3. The structure of claim 1, wherein the buried layer is further interposed between the first well and the semiconductor substrate.

4. The structure of claim 1, wherein the ESD performance including a snapback voltage is improved by increasing the dimension of the buried layer.

5. The structure of claim 1, wherein the ESD performance including HBM ESD passing voltages is improved by increasing the dimension of the buried layer.

6. The structure of claim 1, wherein the buried layer is formed by phosphorus ions.

7. The structure of claim 1, wherein the source region and drain region are formed by arsenic impurity ions.

8. The structure of claim 7, wherein the source region is electrically coupled to the first well via a P+ diffusion contact.

9. An electronic discharge-protected MOS structure comprising:

a P-type semiconductor substrate;
a P-well formed in the semiconductor substrate;
an N-well disposed adjacent to the P-well and formed in the P-type semiconductor substrate;
an N+ source region and a P+ diffusion contact formed in the P-well;
an N+ drain region and a P+ diffusion region formed in the N-well;
at least an oxide and a polysilicon layer formed on top of the P-well and the N-well for forming a gate electrode of the MOS structure; and
a parasitic SCR comprising at least a parasitic PNP bipolar transistor formed by the P+ diffusion region inside the N-well, the N-well, and the semiconductor substrate and at least a parasitic NPN bipolar transistor formed by the N-well, the P-type semiconductor substrate, and the N+ source region formed in the P-well, respectively; and
an N+ buried layer (N+BL) interposed at least between the N-well and the P-type semiconductor substrate, wherein the buried layer lowers a resistance of the semiconductor substrate such that during an ESD event, ESD currents generated from the parasitic SCR are dissipated through the N+ buried layer and the semiconductor substrate, thereby protecting the MOS structure, and
wherein a dimension of the N+ buried layer is adjusted to improve an ESD performance of the MOS structure.

10. The structure of claim 9, wherein the buried layer is further interposed between the P-well and the semiconductor substrate to form a full HV ESD structure.

11. The structure of claim 9, wherein the ESD performance including HMB ESD passing voltages is improved by increasing the N+BL cover ratio.

12. The structure of claim 9, wherein the ESD performance including a snapback voltage is improved by increasing the N+BL cover ratio.

13. The structure of claim 9, wherein the N+ source region is electrically coupled to the P+ diffusion contact formed in the P-well.

14. The structure of claim 9, wherein the N+BL lowers a collector resistance of the parasitic PNP and NPN bipolar transistors.

15. The structure of claim 14, wherein the parasitic SCR is triggered into conduction during an ESD event by the collector-base avalanche of either the PNP bipolar transistor or the NPN bipolar transistor.

16. The structure of claim 9, wherein the N+BL is formed by phosphorus ions.

17. The structure of claim 9, wherein the source region and drain region are firmed by arsenic impurity ions.

* * * * *